United States Patent
Andrys et al.

(10) Patent No.: US 9,698,853 B2
(45) Date of Patent: Jul. 4, 2017

(54) POWER AMPLIFIER OPEN LOOP CURRENT CLAMP

(71) Applicant: SKYWORKS SOLUTIONS, INC., Woburn, MA (US)

(72) Inventors: Paul Raymond Andrys, Swisher, IA (US); David Steven Ripley, Marion, IA (US); Matthew Lee Banowetz, Marion, IA (US); Kyle James Miller, Marion, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/325,314

(22) Filed: Jul. 7, 2014

(65) Prior Publication Data

US 2015/0038092 A1 Feb. 5, 2015

Related U.S. Application Data

(60) Provisional application No. 61/860,548, filed on Jul. 31, 2013.

(51) Int. Cl.
*H04B 1/40* (2015.01)
*H03F 1/02* (2006.01)
(Continued)

(52) U.S. Cl.
CPC ............. *H04B 1/40* (2013.01); *H03F 1/0233* (2013.01); *H03F 1/52* (2013.01); *H03F 3/191* (2013.01);
(Continued)

(58) Field of Classification Search
CPC .... H04B 2001/0408; H04B 2001/0433; H04B 2001/0441
(Continued)

(56) References Cited

U.S. PATENT DOCUMENTS 5,694,084 A * 12/1997 Sakurai .................... H03F 1/48
330/288
6,300,837 B1 10/2001 Sowlati et al.
(Continued)

FOREIGN PATENT DOCUMENTS

JP 2007019784 A 1/2007
KR 10-2016-7002678 1/2016
(Continued)

OTHER PUBLICATIONS

International Search Report and Written Opinion for PCT/US2014/048496 dated Feb. 2, 2016.

*Primary Examiner* — Wen Huang
(74) *Attorney, Agent, or Firm* — Chang & Hale LLP

(57) ABSTRACT

Various implementations include circuits, devices and/or methods that provide open loop current limiting power amplifiers and the like. In some implementations, an open loop current clamp includes a trim module to provide a control value and a limiting source having respective input and output terminals. The input terminal is coupled to the trim module to receive the control value. The output terminal coupled to a control terminal of the first transistor to provide a limiting electrical level produced in response to the control value by the limiting source. The limiting electrical level substantially setting a first mode of operation for the first transistor such that the current draw of the first transistor is substantially determined by the first mode of operation and the limiting electrical level such that a voltage at an output terminal of the first transistor exerts reduced influence on the current draw.

20 Claims, 10 Drawing Sheets

(51) Int. Cl.
*H03F 1/52* (2006.01)
*H03F 3/191* (2006.01)
*H03F 3/24* (2006.01)
*H04B 1/04* (2006.01)

(52) U.S. Cl.
CPC ....... *H03F 3/245* (2013.01); *H03F 2200/426* (2013.01); *H03F 2200/441* (2013.01); *H03F 2200/462* (2013.01); *H04B 2001/0408* (2013.01)

(58) Field of Classification Search
USPC ................................. 455/114.3, 127.1, 127.2
See application file for complete search history.

(56) References Cited

U.S. PATENT DOCUMENTS

| | | | | |
|---|---|---|---|---|
| 7,514,989 | B1* | 4/2009 | Somerville | G05F 3/26 |
| | | | | 327/538 |
| 7,792,506 | B1* | 9/2010 | Wright | H03F 1/0216 |
| | | | | 330/250 |
| 7,957,709 | B1* | 6/2011 | Davenport | H03F 3/19 |
| | | | | 455/127.1 |
| 2002/0024390 | A1 | 2/2002 | Yamashita et al. | |
| 2004/0189398 | A1* | 9/2004 | Noh | H03F 3/19 |
| | | | | 330/296 |
| 2005/0007198 | A1 | 1/2005 | Versteegen | |
| 2006/0006947 | A1* | 1/2006 | Feng | H03F 3/343 |
| | | | | 330/296 |
| 2006/0084403 | A1* | 4/2006 | Gilsdorf | H03F 1/0211 |
| | | | | 455/241.1 |
| 2006/0197594 | A1 | 9/2006 | Scuderi et al. | |
| 2007/0273448 | A1* | 11/2007 | Vaiana | H03F 1/0261 |
| | | | | 330/296 |
| 2008/0100382 | A1* | 5/2008 | Fisher | H03F 1/302 |
| | | | | 330/288 |
| 2008/0211585 | A1* | 9/2008 | Karoui | H03F 1/30 |
| | | | | 330/298 |
| 2009/0170454 | A1* | 7/2009 | Hug | H03F 1/52 |
| | | | | 455/127.2 |
| 2009/0309663 | A1* | 12/2009 | Griffiths | H03F 1/0272 |
| | | | | 330/296 |
| 2012/0146425 | A1* | 6/2012 | Lee | H02J 5/005 |
| | | | | 307/104 |
| 2014/0240049 | A1* | 8/2014 | Won | H03F 3/19 |
| | | | | 330/296 |

FOREIGN PATENT DOCUMENTS

TW 103126267 7/2014
WO PCT/US2014/048496 7/2014

* cited by examiner

POWER AMPLIFIER OPEN LOOP CURRENT CLAMP

RELATED APPLICATIONS

This application claims the benefit of U.S. Provisional Patent Application No. 61/860,548, filed on Jul. 31, 2013, and which is incorporated by reference herein.

TECHNICAL FIELD

The present disclosure relates to electronic circuits, and in particular, to systems, methods and devices configured to control current draw by a power amplifier.

BACKGROUND

Power amplifiers are widely used in various communication networks to set the transmission power level of an information-bearing signal transmitted by one device to another device. For example, power amplifiers are used to set the pulse energy emitted by pulsed lasers in optical communication networks. Power amplifiers are also used in the radio frequency (RF) front end components of wireless carrier network devices—such as base stations, repeaters, and mobile client devices (e.g. mobile phones, smartphones, tablet computers, etc.)—to set the power level of a wireless signal transmitted through an antenna. Power amplifiers are also used in local area networks of homes and offices to support both wired and wireless connectivity of servers, computers, laptops, and peripheral devices such as photocopiers and printers.

In a mobile device relying on a battery, managing the operation of a power amplifier is of interest because the efficiency of the power amplifier is often a significant factor in the overall efficiency of the RF front end, and in turn, the battery life of the mobile device. Additionally, in part because of the high power levels at which a power amplifier operates relative to the other components in the RF front end, a power amplifier can cause device failure when the power amplifier is not prevented from drawing excessive current and/or causing a voltage spike, both of which can reach destructive levels.

In order to set the operating conditions for efficient operation, a preferred current draw of a power amplifier can be, in part, initially set by impedance matching the power amplifier to the antenna (or other transmission load), so that the power amplifier operates within a designed quiescent range set by bias circuitry. However, even when a power amplifier is impedance matched to an antenna, the power amplifier may draw excessive current and/or cause a voltage spike when subjected to unanticipated antenna load conditions. Consequently, battery life is reduced and device failure may occur if the excessive current and/or cause a voltage spike reach destructive levels.

BRIEF DESCRIPTION OF THE DRAWINGS

So that the present disclosure can be understood by those of ordinary skill in the art, a more detailed description may be had by reference to aspects of some illustrative implementations, some of which are shown in the accompanying drawings.

Figure 1:
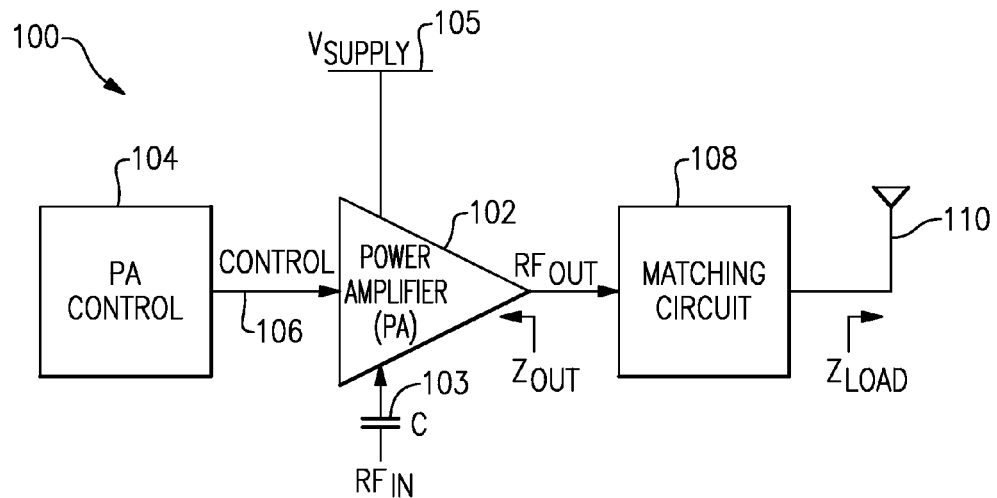
FIG. 1 is a schematic diagram of a power amplifier operating control configuration according to some implementations.

In accordance with common practice various features shown in the drawings may not be drawn to scale, as the dimensions of various features may be arbitrarily expanded or reduced for clarity. Moreover, the drawings may not depict all of the aspects and/or variants of a given system, method or apparatus admitted by the specification. Finally, like reference numerals are used to denote like features throughout the drawings.

SUMMARY

Various implementations of circuits, methods and devices within the scope of the appended claims each have several aspects, no single one of which is solely responsible for the attributes described herein. Without limiting the scope of the appended claims, some prominent features are described. After considering this disclosure, and particularly after considering the section entitled "Detailed Description," one will understand how the aspects of various implementations enable open loop current limiting for power amplifiers.

Some implementations include an open loop current clamp to restrict the current draw of a first transistor. In some implementations, the open loop current clamp includes a trim module to provide a control value and a limiting source having respective input and output terminals. The input terminal is coupled to the trim module to receive the control value. The output terminal coupled to a control terminal of the first transistor to provide a limiting electrical level produced in response to the control value by the limiting source. The limiting electrical level substantially setting a first mode of operation for the first transistor such that the current draw of the first transistor is substantially determined by the first mode of operation and the limiting electrical level such that a voltage at an output terminal of the first transistor exerts reduced influence on the current draw.

Some implementations include a power amplifier having an open loop current clamped first transistor. In some implementations, the open loop current clamp includes a trim module to provide a control value and a limiting source having respective input and output terminals. The input terminal is coupled to the trim module to receive the control value. The output terminal coupled to a control terminal of the first transistor to provide a limiting electrical level produced in response to the control value by the limiting source. The limiting electrical level substantially setting a first mode of operation for the first transistor such that the current draw of the first transistor is substantially determined by the first mode of operation and the limiting electrical level such that a voltage at an output terminal of the first transistor exerts reduced influence on the current draw.

Some implementations include a power amplifier module. The power amplifier module, in some implementations, includes a packaging substrate configured to receive a plurality of components; a power amplifier circuit provided in a die included on the packaging substrate, the power amplifier including a first transistor having a control terminal and an output terminal; a trim module to provide a control value; a limiting source having respective input and output terminals, the input terminal coupled to the trim module to receive the control value, and the output terminal coupled to the control terminal of the first transistor to provide a limiting electrical level produced in response to the control value by the limiting source, the limiting electrical level substantially setting a first mode of operation for the first transistor such that the current draw of the first transistor is substantially determined by the first mode of operation and the limiting electrical level such that a voltage at the output terminal of the first transistor exerts reduced influence on the current draw.

Some implementations include a radio frequency (RF) device. In some implementations, the RF device includes a transceiver configured to process RF signals; an antenna in communication with the transceiver configured to facilitate transmission of an amplified RF signal; and a power amplifier module connected to the transceiver and configured to generate the amplified RF signal. In some implementations, the power amplifier module includes a first transistor, a trim module to provide a control value, and a limiting source having respective input and output terminals, the input terminal coupled to the trim module to receive the control value, and the output terminal coupled to a control terminal of the first transistor to provide a limiting electrical level produced in response to the control value by the limiting source, the limiting electrical level substantially setting a first mode of operation for the first transistor such that the current draw of the first transistor is substantially determined by the first mode of operation and the limiting electrical level such that a voltage at an output terminal of the first transistor exerts reduced influence on the current draw.

Some implementations include a method of clamping the current of a first transistor. In some implementations, the method includes producing a control value using a trim module to compensate for at least one of temperature and manufacturing process variations; generating a limiting electrical level using the control value; and, applying the limiting electrical level to a control terminal of a first transistor.

DESCRIPTION

Numerous details are described herein in order to provide a thorough understanding of the example implementations illustrated in the accompanying drawings. However, the invention may be practiced without many of the specific details. Well-known methods, components, and circuits have not been described in exhaustive detail so as not to unnecessarily obscure more pertinent aspects of the implementations described herein.

As noted above, in order to set the operating conditions for efficient operation, a preferred current draw of a power amplifier can be, in part, initially set by impedance matching the power amplifier to the antenna (or other transmission load), so that the power amplifier operates within a designed quiescent range set by bias circuitry. Those skilled in the art will appreciate that impedance matching refers to matching the output impedance of a circuit that transmits a signal and the input impedance of a circuit that receives the signal in order to obtain efficient power transfer. When a power amplifier and a transmission load (e.g. an antenna) are impedance matched, efficient power transfer may be obtained, and the generation of a reflected wave from the transmission load may be suppressed. Impedance matching also sets the preferred voltage standing wave ratio (VSWR) between power amplifier and the transmission load. Those skilled in the art will appreciate from the present disclosure that VSWR may be briefly described as a ratio of a maximum value of a voltage standing wave to a minimum value of the voltage standing wave. Moreover, those skilled in the art will appreciate that a voltage standing wave on a transmission path between the power amplifier and the transmission load is the combination of a transmission signal emitted by the power amplifier, and a reflected signal from the transmission load to the power amplifier.

Impedance matching is often fixed such that the impedances match over a particular range of frequencies, load angles, temperatures, environmental conditions and physical attributes of the impedance matched components. However, during operation one or more of the various factors may change—such as changes in the operating environment (temperature, humidity, etc.), deterioration due to aging, and/or physical damage—that in turn changes the effective input impedance of the transmission load temporarily or permanently. Changes to the effective impedance of the transmission load cause an impedance mismatch between the transmission load and power amplifier. In turn, a reflected voltage wave is generated, and the VSWR between power amplifier and the transmission load shifts from the designed range. When the VSWR moves outside of the designed range the power amplifier may operate outside of the designed quiescent range and draw excessive current and/or cause a voltage spike. Depending on the magnitude of the VSWR change, the power amplifier may draw an excessive current and/or cause a voltage spike that is destructive to the power amplifier or components situated near the power amplifier.

In other words, even when a power amplifier is impedance matched to an antenna, the power amplifier may draw excessive current and/or cause a voltage spike when subjected to unanticipated antenna load conditions. Consequently, battery life is reduced and device failure may occur if the excessive current and/or cause a voltage spike reach destructive levels.

FIG. 1, for example is a schematic diagram of an example power amplifier (PA) operating configuration 100 according to some implementations. While pertinent features are illustrated, those skilled in the art will appreciate from the present disclosure that various other features have not been illustrated for the sake of brevity and so as not to obscure more pertinent aspects of the example implementations disclosed herein. To that end, as a non-limiting example, the PA operating configuration 100 includes a PA 102, a PA control module 104, a matching circuit 108 and an antenna 110. The PA control module 104 is coupled to the PA 102 through control line 106 in order to provide at least one control signal to the PA 102. The PA 102 is coupled to receive a RF input signal ($RF_{in}$) through coupling capacitor 103 (C), and provide an amplified RF output signal ($RF_{out}$) to the antenna 110 through the matching circuit 108. The PA 102 draws a DC operating current from the voltage supply 105.

In some implementations, the capacitor 103 is implemented as, for example, a single capacitor to block undesired DC currents and/or voltages from the input node of the PA 102, while allowing the transfer of RF signals. In some implementations, the capacitor 103 is implemented as a multi-component capacitive network. Alternatively, although FIG. 1 shows the capacitor 103, it will be understood that one or more features of the present disclosure can also be implemented in a system or device without such a similarly situated capacitance. Similarly, in some implementations, a RF choke inductor (not shown) can be placed in series between the voltage supply 105 and the PA 102 to prevent RF energy transfer between the voltage supply 105 and the PA 102.

In order to maintain the operating conditions for an efficient range of operation, a preferred current draw of the PA 102 can be in part initially maintained by impedance matching the PA 102 to the antenna 110. In other words, the matching circuit 108 impedance matches the PA 102 to the antenna 110 so that the PA 102 operates within the designed current range. Those skilled in the art will appreciate from the present disclosure that a matching circuit generally includes a combination of capacitive and inductive components, and/or transmission lines, etc. In some implementations, the PA 102 is not conjugately matched to the load, as is done with a small signal amplifier. For a large signal PA, the output match presents a preferred load line to the PA collector in order to improve voltage and current excursions, and thus, the resulting power delivered to the load. When the PA 102 and the antenna 110 are impedance matched the generation of a reflected wave from the antenna 110 is suppressed, which encourages efficiency.

The impedance matching circuit 108 also sets the preferred voltage standing wave ratio (VSWR) between the PA 102 and the antenna 110. In some implementations, the preferred standing wave is reduced to negligible, if not non-existent, levels. In some implementations, the preferred standing wave occurs when the min-to-max voltage ratio is close to one within a level of tolerance. Those skilled in the art will appreciate from the present disclosure that VSWR is generally described as a ratio of a maximum value of a voltage standing wave to a minimum value of the voltage standing wave. Moreover, those skilled in the art will appreciate that a voltage standing wave on a transmission path between the PA 102 and the antenna 110 is the combination of a transmission signal emitted by the PA 102 and a reflected signal from the antenna 110.

Impedance matching is often fixed such that the matching circuit 108 matches impedances over a particular range of frequencies, load angles, temperatures, environmental conditions and various physical attributes of the impedance matched components. However, during operation one or more of the aforementioned factors may change, which in turn causes an impedance mismatch between the components temporarily or permanently. Such changes include, for example, changes in the operating environment (temperature, humidity, etc.), deterioration due to aging, and/or physical damage to the antenna 110, which changes the effective input impedance, $Z_{in}$, of the antenna 110. Changes to the effective input impedance, $Z_{in}$, of the antenna 110 cause an impedance mismatch between the antenna 110 and the PA 102. In turn, a reflected voltage wave is generated, and the VSWR between the PA 102 and the antenna 110 shifts from the designed range. When the VSWR moves outside of the designed range the PA 102 may operate outside of the designed quiescent range and draw excessive current and/or cause a voltage spike. Depending on the magnitude of the VSWR change, the excessive current and/or voltage spike may be destructive to the PA 102 and/or RF front end components situated near the PA 102.

In other words, even when a power amplifier is initially impedance matched to an antenna, the power amplifier may draw excessive current and/or cause a voltage spike when subjected to unanticipated antenna load conditions that affect the impedance match. Consequently, battery life is reduced and device failure may occur if the excessive current and/or voltage spike reach destructive levels. Accordingly, a control circuit, such as the PA control circuit 104 shown in FIG. 1, is used to limit the current draw by the power amplifier (e.g. the PA 102).

The various implementations described herein include systems, methods and/or circuit-based devices provided to limit current draw by a power amplifier from a power supply. Numerous details are described herein in order to provide a thorough understanding of the example implementations illustrated in the accompanying drawings. However, the invention may be practiced without many of the specific details. Well-known methods, components, and circuits have not been described in exhaustive detail so as not to unnecessarily obscure more pertinent aspects of the implementations described herein.

Figure 2:
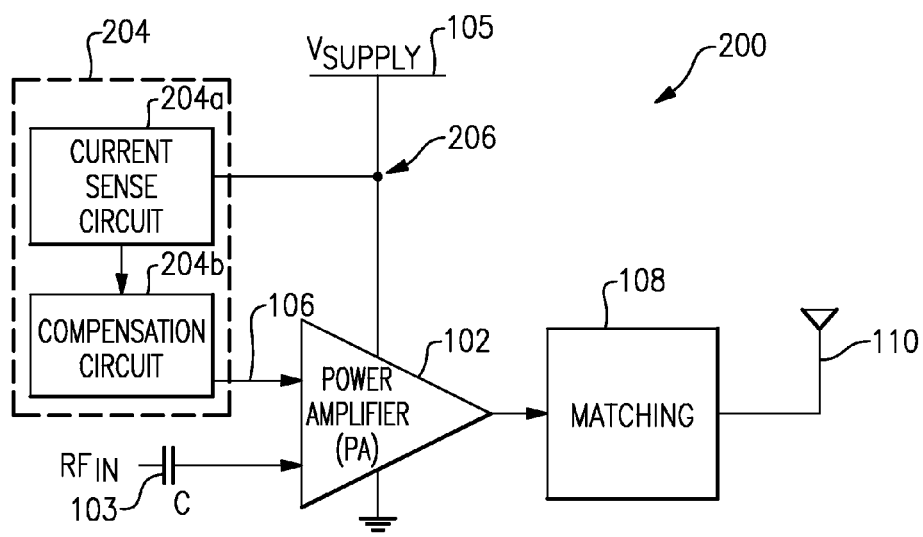
FIG. 2 is a schematic diagram of a closed loop current clamp circuit provided to control the operation of a power amplifier according to some implementations.

To that end, FIG. 2 is a schematic diagram of a closed loop current clamp circuit 200 provided to control the operation of a power amplifier according to some implementations. The closed loop current clamp circuit 200 illustrated in FIG. 2 is similar to and adapted from the PA operating configuration 100 illustrated in FIG. 1. Elements common to each include common reference numbers, and only the differences between FIGS. 1 and 2 are described herein for the sake of brevity. Moreover, while certain specific features are illustrated, those skilled in the art will appreciate from the present disclosure that various other features have not been illustrated for the sake of brevity and so as not to obscure more pertinent aspects of the example implementations disclosed herein.

Specifically, the closed loop current clamp circuit 200 includes a current clamp 204 arranged in a closed feedback loop with the PA 100. The current clamp 204 includes a current sense circuit 204a and a compensation circuit 204b. The current sense circuit 204a is coupled to sense the current drawn by the PA 102 from the voltage supply 105. In some implementations using bipolar junction transistors (BJTs), the current draw by the PA 102 is often referred to as at least one of the collector and emitter currents of a respective BJT included in the PA 102. The current sense circuit 204a is also coupled to the compensation circuit 204b to provide an indication of the sensed current. For example, in some implementations, the indication of the sensed current is an electrical signal proportional to the sensed current, such as a voltage or current.

The compensation circuit 204b provides the control signal on control line 106 to the PA 102. The control signal causes the PA 102 to adjust the current draw from the voltage supply 105. In some implementations, the control signal is at least one of a new bias current and voltage. Additionally and/or alternatively, in some implementations, the control signal is a representation of a change to at least one of a bias current and voltage to be made by power control circuitry (see FIG. 12) associated with the PA 102.

Figure 3:
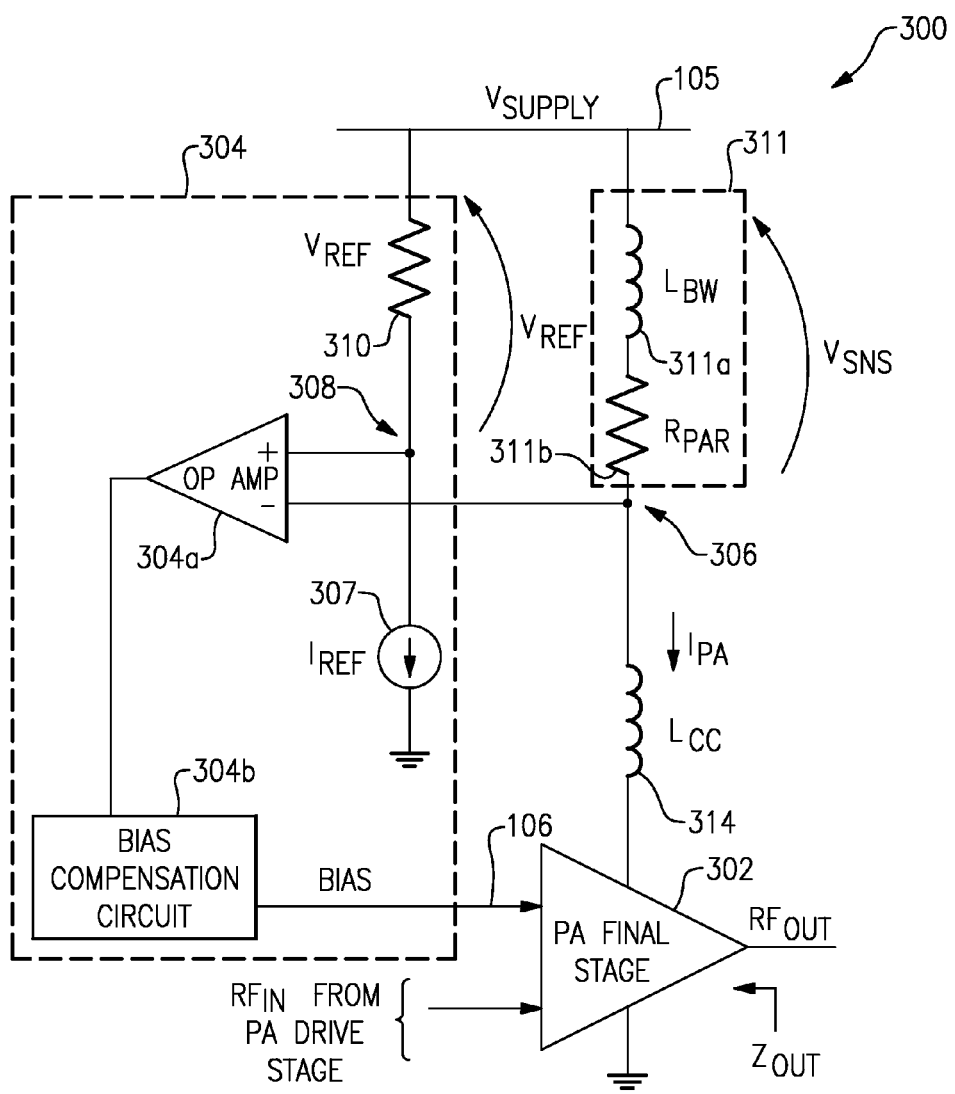
FIG. 3 is a schematic diagram of a closed loop current clamp circuit provided to control the operation of a power amplifier according to some implementations.

FIG. 3 is a schematic diagram of a closed loop current clamp circuit 300 provided to control the operation of a power amplifier according to some implementations. The closed loop current clamp circuit 300 illustrated in FIG. 3 is similar to and adapted from the closed loop current clamp circuit 200 illustrated in FIG. 2. Elements common to each include common reference numbers, and only the differences between FIGS. 2 and 3 are described herein for the sake of brevity. Moreover, while certain specific features are illustrated, those skilled in the art will appreciate from the present disclosure that various other features have not been illustrated for the sake of brevity and so as not to obscure more pertinent aspects of the example implementations disclosed herein.

Specifically, the closed loop current clamp circuit 300 includes a bond wire 311 in series with a bias choke inductor 314 ($L_{CC}$) between the voltage supply 105 and a final stage of the power amplifier 302. In some implementations, the bond wire 311 includes two or more parallel bond wires. As an approximation, the bond wire 311 is modeled as having parasitic inductive and resistive components, shown in FIG. 3 as inductor 311a ($L_{BW}$) and parasitic resistor 311b ($R_{PAR}$). Additionally and/or alternatively, in some implementations, one or more surface mount resistors (not shown) are coupled in series between the choke inductor 314 and the voltage supply 105.

The closed loop current clamp circuit 300 also includes a current clamp 304. The current clamp 304 includes a reference resistor 310 ($R_{REF}$) and a reference current source 307 ($I_{REF}$) connected in series between the voltage supply 105 and ground. The current clamp 304 also includes an op-amp 304a arranged to compare the voltage drop, $V_{REF}$, across the reference resistor 310 to the voltage drop, $V_{SNS}$, across the bond wire 311. To that end, one input terminal of the op-amp 304a is coupled to node 308 between the reference resistor 308 and reference current source 307, and another input terminal of the op-amp 304a is coupled to node 306 between the bond wire 311 and choke inductor 314. An output terminal of the op-amp 304a is coupled to a bias compensation circuit 304b, which is, in turn, coupled to the PA final stage 302 via control line 106 to deliver a new bias voltage and/or current. The op-amp 304a and bias compensation circuit 304b thus form a closed loop integrator with the PA final stage 302.

In operation, an indication of the current, $I_{PA}$, drawn by the PA final stage 302 is a voltage error signal proportional to the difference between the current $I_{PA}$ and the reference current $I_{REF}$. More specifically, a DC voltage $V_{SNS}$ is developed across the bond wire(s) 311 (and/or resistors) that is proportional to the current drawn $I_{PA}$ by the PA final stage 302. In other words, the DC voltage $V_{SNS}$ serves as a proxy for adjusting current draw by the PA final stage 302.

The voltage $V_{SNS}$ is continuously compared to the reference voltage $V_{REF}$ across the reference resistor 310 using the op-amp 304a which generates and provides a voltage error to the bias compensation circuit 304b. Under high current conditions, the bond wire voltage $V_{SNS}$ exceeds the reference voltage $V_{REF}$, and the PA driver collector voltage is reduced, decreasing the RF drive to the PA final stage 302 and decreasing the final stage collector current $I_{PA}$. This process continues until the closed loop integrator voltage error generated by the op-amp 304a is driven to zero at which point the final collector current is approximately equal to the desired current limit threshold determined by the integrator reference voltage $V_{REF}$.

In other words, the current draw by the PA final stage 302 is initially permitted to deviate away from the preferred designed range before the closed loop integrator reacts to reduce the current draw back to within an acceptable range. The time it takes to reduce the current back to within an acceptable range may lead to performance risks in some implementations. For example, because the current draw by the PA final stage is permitted to deviate substantially, in some instances, the current $I_{PA}$ may reach potentially destructive levels before the current is reduced by the closed loop integrator. Additionally, with this approach, in some implementations precise routing of the two sense PCB traces and additional RF decoupling components are used to avoid bias controller RF rectification which may result in clamp threshold variation with power and frequency.

Figure 4:
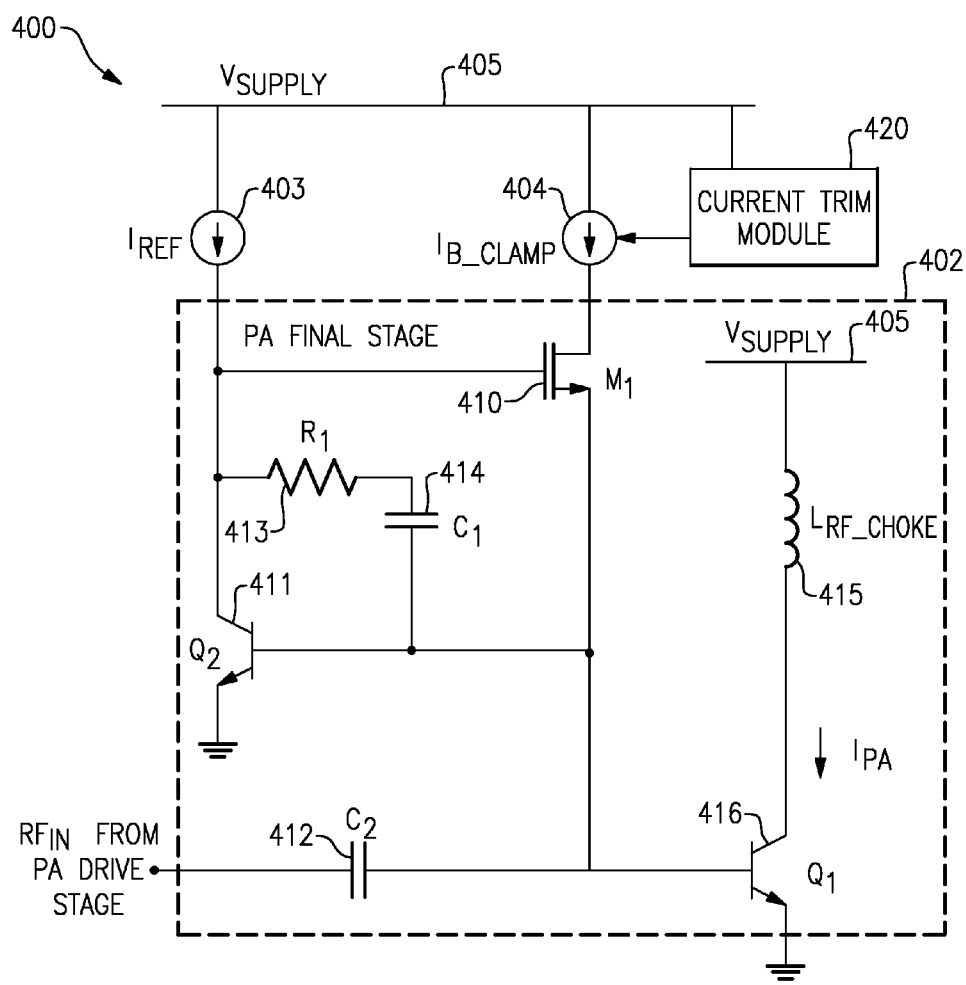
FIG. 4 is a schematic diagram of an open loop current clamp circuit provided to control the operation of a power amplifier according to some implementations.

By contrast, FIG. 4 is a schematic diagram of an open loop current clamp circuit 400 provided to control the operation of a power amplifier according to some implementations. Briefly, the open loop current clamp 400 includes a pre-clamped current source that substantially reduces the ability of a power amplifier to draw excessive current from the voltage supply and substantially removes the need for a reactive mechanism to control current draw. In some implementations, the open loop current clamp includes a pre-clamped current source, and a current trim module. The current output of the pre-clamped current source is limited to a programmable current level set by the current trim module. To that end, the open loop current clamp circuit 400 of FIG. 4 includes a voltage supply 405, a reference current source 403 ($I_{REF}$), a limiting current source 404 ($I_{b\_clamp}$, i.e., the pre-clamped source), a trim module 420, and a PA final stage 402 an example active load.

The PA final stage 402 includes a first transistor 416 ($Q_1$). In some implementations, first transistor 416 ($Q_1$) is a single transistor. Additionally and/or alternatively, in some implementations, the first transistor 416 ($Q_1$) comprises an array of transistors that can be schematically represented by $Q_1$. In various implementations, $Q_1$ is one of a bipolar junction transistor (BJT), and a heterojunction bipolar transistor (HBT). For the sake of example only, and without loss of generality, the first transistor 416 ($Q_1$) will be described as a BJT hereinafter. An RF choke inductor 415 is placed in series between the voltage supply 405 and the first transistor 416 ($Q_1$) to prevent RF energy transfer between the voltage supply 405 and the first transistor 416 ($Q_1$). A DC block capacitor 412 ($C_2$) is coupled to the base of the first transistor 416 ($Q_1$) to block undesired DC currents and/or voltages from the base of the first transistor 416 ($Q_1$), while allowing the transfer in of an RF signal from a PA drive stage (not shown).

The quiescent DC biasing of the first transistor 416 ($Q_1$) is provided by a current mirror, and the combination of the limiting current source 404 and current trim module 420. The current mirror includes a second transistor 411 ($Q_2$), a beta helper 410 ($M_1$) and the aforementioned reference current source 403. The collector (i.e., an input terminal) of the second transistor 411 ($Q_2$) is coupled to the output of the reference current source 403. The base of the second transistor 411 ($Q_2$) is coupled to the base of the first transistor 416 ($Q_1$). The base of a BJT can be used control the operation of the BJT. Accordingly, as used herein, the base is referred to as a control terminal. Thus, with continued reference to FIG. 4, in other words, the control terminal of the second transistor 411 ($Q_2$) is coupled to the control terminal of the first transistor 416 ($Q_1$). The current mirror includes a resistor 413 ($R_1$) and a capacitor 414 ($C_1$) in series between the input terminal and control terminal of the second transistor 411 ($Q_2$) to provide stability.

In some implementations, the first transistor 416 ($Q_1$) and the second transistor 411 ($Q_2$) are together characterized by a characterized by a device area ratio. The device area ratio is used to determine in part the current draw by the first transistor 416 ($Q_1$) relative to the output of the reference current source 403.

The beta helper 410 ($M_1$) includes a MESFET transistor having first, second and third terminals. Although a MESFET transistor is shown, in some implementations the beta helper 410 ($M_1$) is a MOS or JFET transistor. The first terminal (i.e., the gate) of the beta helper 410 ($M_1$) is coupled to the output of the reference current source 403. The second terminal (i.e., the drain) of the beta helper 410 ($M_1$) is coupled to the output of the limiting current source 404. The third terminal (i.e., the source) of the beta helper 410 ($M_1$) is coupled to the control terminal (i.e, the base) of the first transistor 416 ($Q_1$).

In operation, the quiescent collector current of the first transistor 416 ($Q_1$) is can be approximated according to equation (1):

$$I_{CQ1} = A \cdot I_{REF} \quad (1)$$

where A is the device area ratio ($Q_2/Q_1$) between the first and second transistors $Q_1$ and $Q_2$.

The collector current, $I_{CQ1}$, and the base current, $I_{BQ1}$, can be approximated by equation (2):

$$I_{CQ1} = \beta(\text{temperature,Process}) \cdot I_{BQ1} \quad (2)$$

where $\beta$ is the current gain of the first transistor 416 ($Q_1$), which varies as a function of temperature and manufacturing process characteristics.

In some implementations, the collector current, $I_{CQ1}$, of the first transistor 416 ($Q_1$) is clamped by fixing the base current, $I_{BQ1}$, of the first transistor 416 ($Q_1$) using the combination of the limiting current source 404 and current trim module 420. More specifically, the current trim module 420 provides a control value to the limiting current source 404. The limiting current source in turn creates a limiting electrical level, current $I_{b\_clamp}$, in response to receiving the control value. The current $I_{b\_clamp}$, when provided to the base of the first transistor 416 ($Q_1$), ensures that the first transistor 416 ($Q_1$) remains in an active-mode of operation, where for BJTs, the collector current is substantially determined by the base current, and substantially independent of the voltage at the collector. That is, the current draw by the first transistor 416 ($Q_1$) is less susceptible to voltage changes at an output terminal of the first transistor 416 ($Q_1$). More generally, limiting electrical level substantially sets a first mode of operation (e.g., active mode for BJTs) for the first transistor such that the current draw of the first transistor is substantially determined by the first mode of operation and the limiting electrical level such that a voltage at an output terminal of the first transistor exerts reduced influence on the current draw.

By contrast, without the combination of the limiting current source 404 and current trim module 420, a standard current mirror (not shown) is more susceptible to voltage variations at the collector (or drain) of the output transistor. As such, the load (e.g. an antenna) coupled to the output transistor is typically required to ensure that the output transistor operates in the active-mode for a BJT. As, noted above, impedance matching can be used to match the output of impedance of the output transistor to the input impedance of the load in order to set the initial operating conditions. However, as also noted above, impedance matching is often fixed, and thus, cannot alone ensure the desired operating conditions over the life of the device. An appreciable change in the VSWR at the output terminal of the output transistor can change the current draw of the output transistor, and in turn, the other portions of the current mirror.

Figure 5:
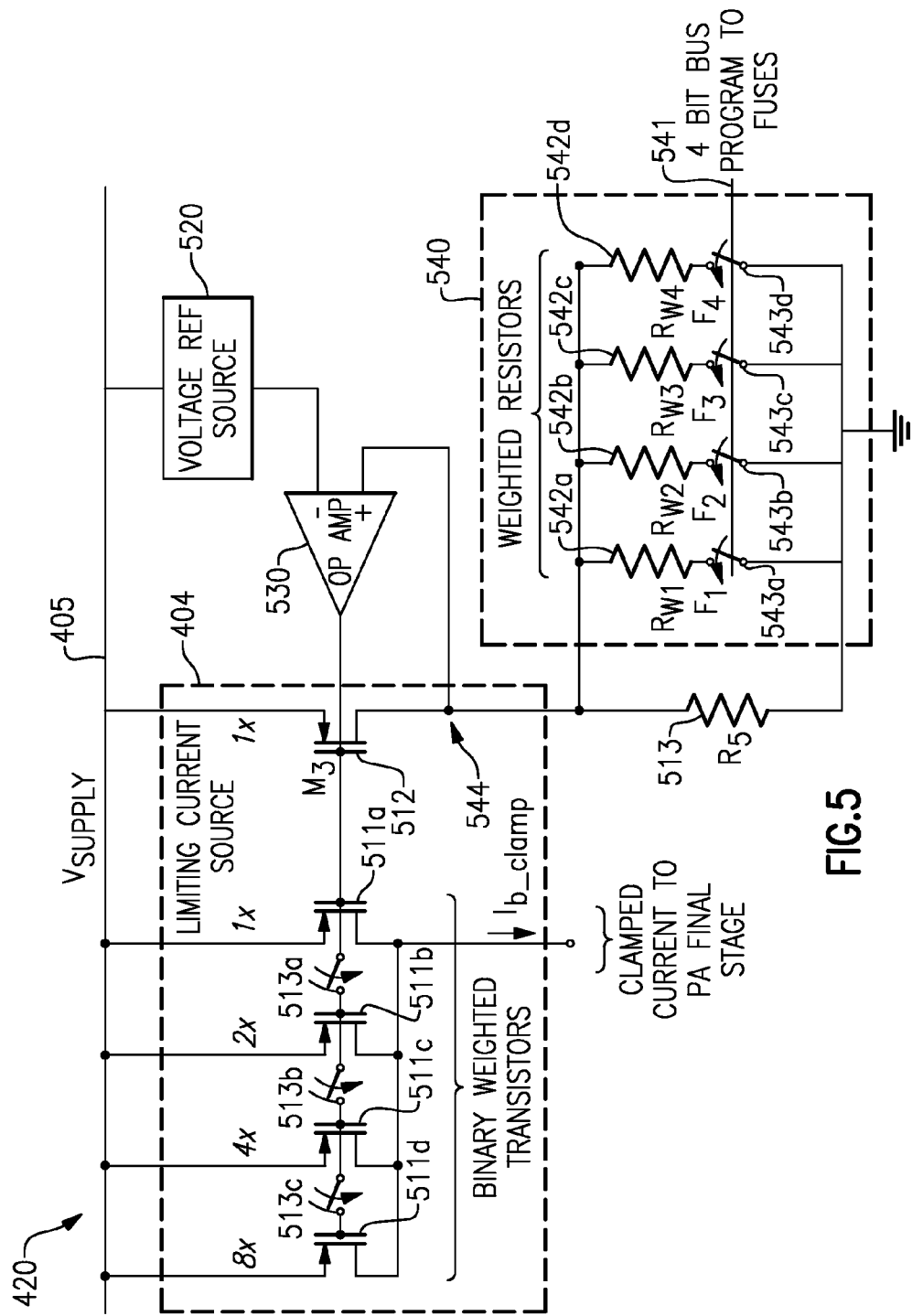
FIG. 5 is a schematic diagram of a current trim circuit included in the open loop current clamp circuit of FIG. 4.

With continued reference to FIG. 4, to compensate for temperature and part-to-part process variation and to meet an overall +/−5% current clamp threshold variation specification, the reference voltage is trimmed at production test using programmable resistive fuses. FIG. 5 is a schematic diagram of the combination of the limiting current source 404 and the current trim module 420 included in FIG. 4.

The limiting current source 404 includes an adjustable current mirror. The adjustable current mirror includes a first PMOS transistor 512 ($M_3$). The source of the first PMOS transistor 512 ($M_3$) is coupled to the voltage supply 405, and the drain is coupled to node 544. The adjustable current mirror also includes a plurality of transistors 511a, 511b, 511c, 511d. The respective sources of the plurality of transistors 511a, 511b, 511c, 511d are each coupled to the voltage supply 405. The respective drains are each coupled to one another, and ultimately to the base of the first transistor 416 ($Q_1$) of FIG. 4 to supply the limiting current level, $I_{BQ1}$ or $I_{b\_clamp}$. The gate of the transistor 511a is coupled to the gate of the first PMOS transistor 512 ($M_3$) in order to provide the basis of the adjustable current mirror. The gate of the transistor 511b is selectively connectable to the gate of the first PMOS transistor 512 ($M_3$) using switch 513a in order to provide a two-fold (2×) increase in the reference current of the current mirror. Similarly, the gate of the transistor 511c is selectively connectable to the gate of the first PMOS transistor 512 ($M_3$) using switch 513b in order to provide a four-fold (4×) increase in the reference current of the current mirror. Similarly, the gate of the transistor 511d is selectively connectable to the gate of the first PMOS transistor 512 ($M_3$) using switch 513c in order to provide an eight-fold (8×) increase in the reference current of the current mirror. In operation, the adjustable current mirror allows for dynamic adjustment of the limiting current after trim fuses resistors have been set through the operation of the switches 513a, 513b, 513c.

In some implementations, the limiting current source 404 includes a non-adjustable current source including a pair of gate-coupled PMOS transistors, with the respective source terminal of each coupled to the voltage supply 405, and the drain of one is coupled to the base of the first transistor 416 ($Q_1$) of FIG. 4 to supply the limiting current level, $I_{BQ1}$ or $I_{b\_clamp}$.

The current trim module 420 includes a voltage reference source 520, an adjustable load 540, and an op-amp 530 serving as a control value generator. The adjustable load 540 is coupled to sink current from the drain of $M_3$. The output terminal of the op-amp 530 is coupled to the gates of $M_2$ and $M_3$ to set the limiting current level, $I_{BQ1}$. In other words, the output of the op-amp 530 is a control value applied to the limiting current source 404. In some implementations, the control value is a function of the reference voltage and a voltage drop across the adjustable resistive load. In some implementations, the control value is a function of the difference between the reference voltage and the voltage drop across the resistive load.

In some implementations, the adjustable load 540 includes a plurality of parallel resistors 542a, 542b, 542c, 542d (i.e., $R_{W1}$, $R_{W2}$, $R_{W3}$, $R_{W4}$) selectively connectable to a common node 544. The adjustable load also includes a plurality of switches (or fuses) 543a, 543b, 543c, 543d (i.e., $F_1$, $F_2$, $F_3$, $F_4$) coupled to selectively connect one or more of the respective resistors to the common node 544 in order to change the effective resistance of the adjustable resistive load 540. To that end, the adjustable load 540 also includes a control bus 541 coupled to the plurality of switches to provide respective control signals. In some implementations, each of the plurality of resistors has a weighted value relative to at least one other of the plurality of resistors. In some implementations, the adjustable resistive load 540 is arranged in parallel with a fixed resistor 513 ($R_5$). In operation, the resistors are selectively coupled to the common node 544 to trim the current provided by the limiting current source 404.

Figure 6:
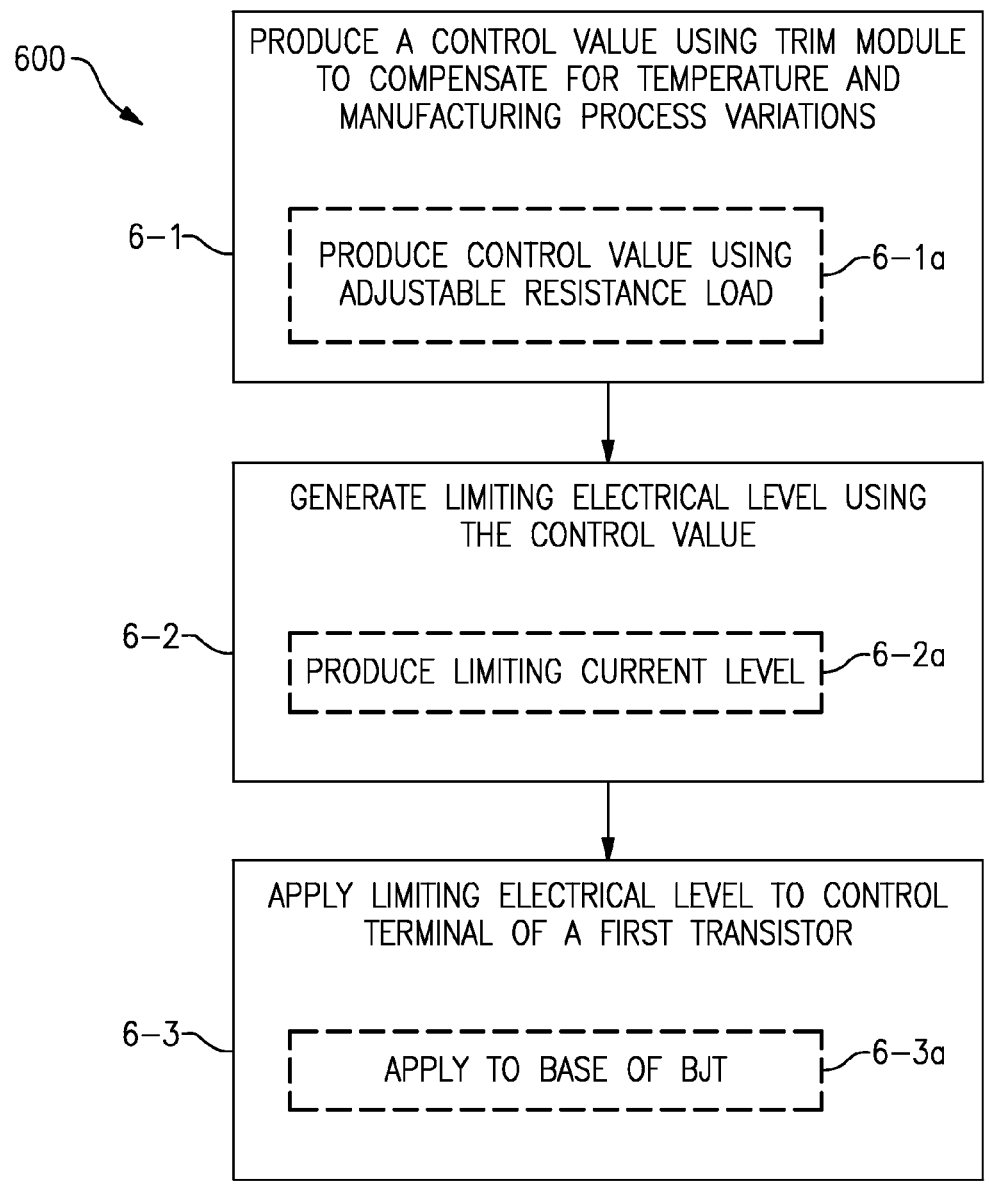
FIG. 6 is a flowchart of an implementation of a method of clamping the current drawn by a power amplifier according to some implementations.

FIG. 6 is a flowchart of an implementation of a method 600 of clamping the current drawn by a power amplifier. In some implementations, method 600 is performed by a power management system and/or controller associated with a power amplifier. Briefly, method 600 includes setting and applying a limiting electrical level to the control terminal of a first transistor in order to set the operating mode of the first transistor. To that end, as represented by block 6-1, method 600 includes producing a control value to compensate for temperature and manufacturing process variations. For example, as represented by block 6-1a and with further reference to FIG. 5, a control value can be produce using an adjustable resistive load.

As represented by block 6-2, the method 600 includes generating a limiting electrical level using the control value. In some implementations, as represented by block 6-2a, the method includes generating a limiting current level. As represented by block 6-3, the method 600 includes applying the limiting electrical level to a control terminal of a first transistor. In some implementations, as represented by block 6-3a, the method includes applying a limiting current level to the base of a BJT.

Figure 7:
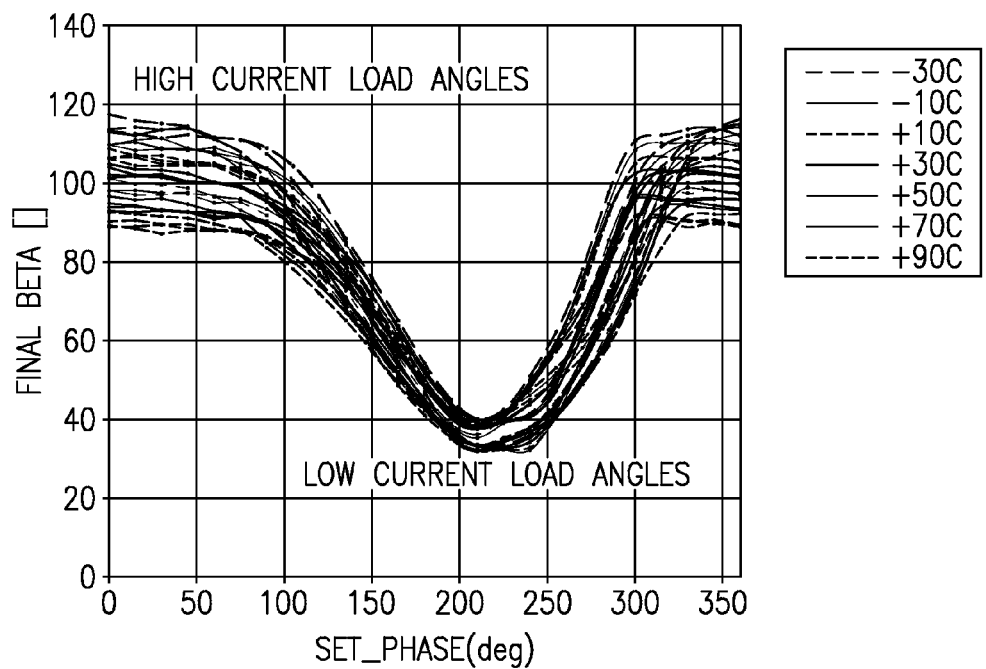
FIG. 7 is a performance diagram showing a power amplifier final stage beta versus load angle under current limits imposed by an implementation of the open loop current clamp circuit of FIG. 4.

FIG. 7 is a performance diagram showing a PA final stage beta versus load angle under current limits imposed by an implementation of the open loop current clamp circuit of FIG. 4. Specifically, FIG. 7 shows the PA final stage beta under current limit over temperature, supply, and load angle. At high current load angles, beta maintains a high nominal value which is desirable to reduce the area requirement for the clamp current source 404 of FIG. 4. The temperature characteristic of beta in this operation region is uniform and linear over temperature which reduces the complexity of the temperature compensation circuitry.

Figure 8:
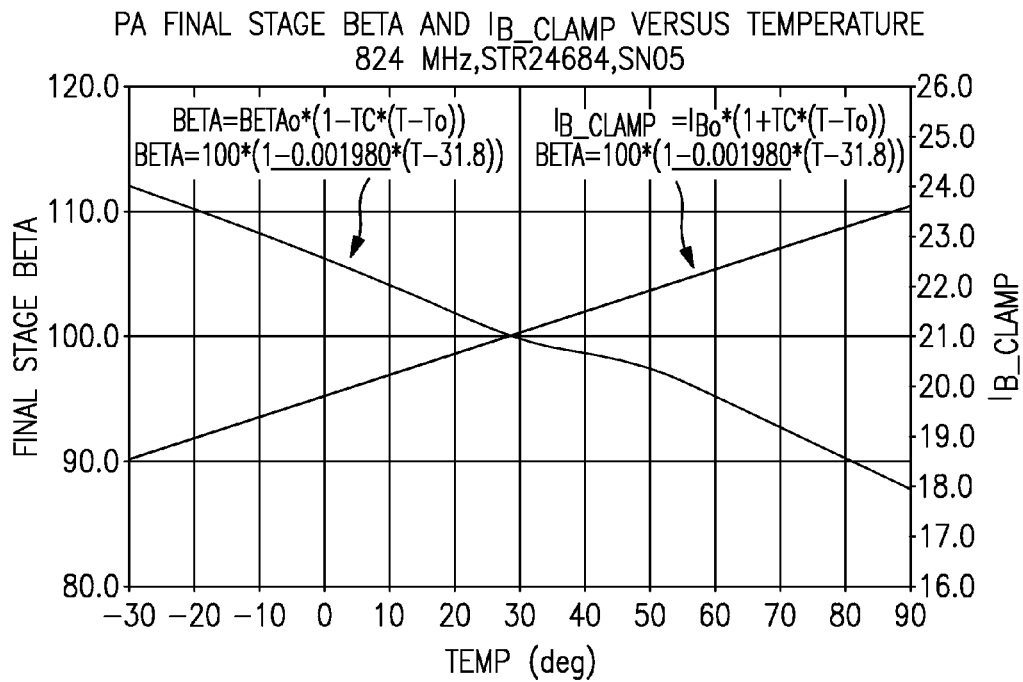
FIG. 8 is a performance diagram showing a power amplifier final stage beta versus temperature under current limits imposed by an implementation of the open loop current clamp circuit of FIG. 4.
Figure 9:
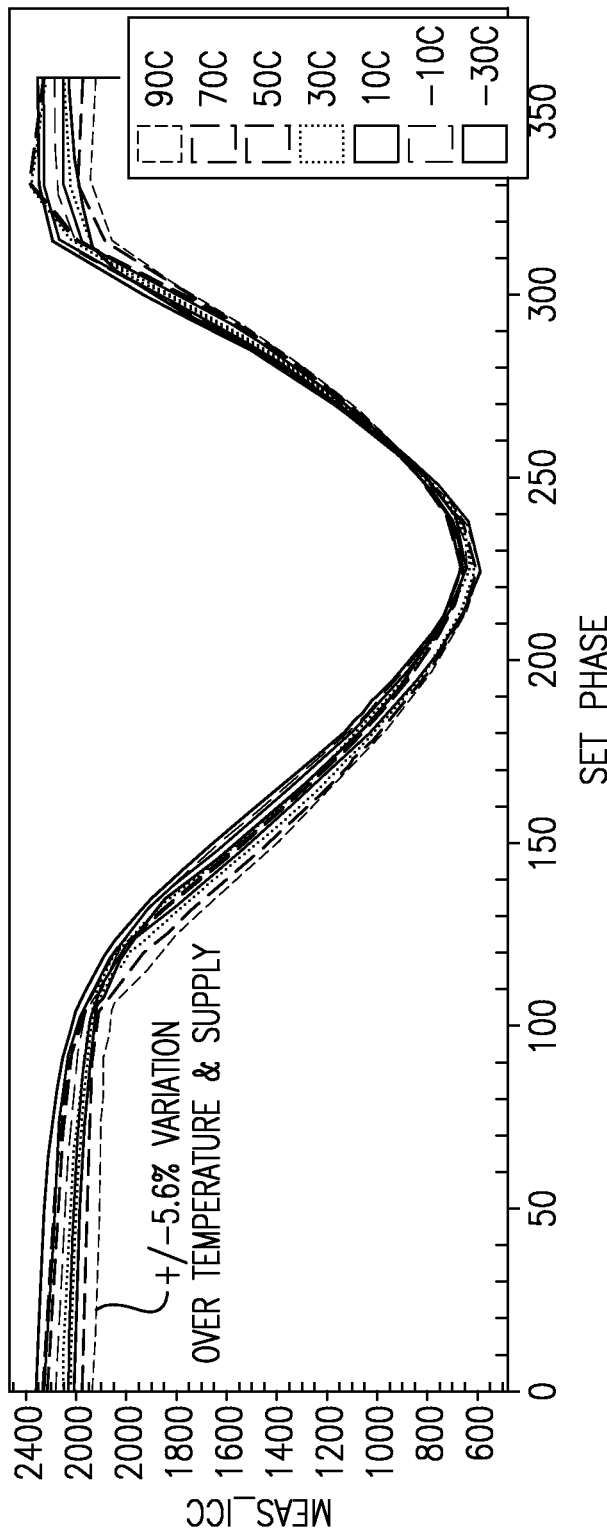
FIG. 9 is a performance diagram showing a power amplifier final stage collector current versus load angle under current limits imposed by an implementation of the open loop current clamp circuit of FIG. 4.

FIG. 8 is a performance diagram showing a power amplifier final stage beta versus temperature under current limits imposed by an implementation of the open loop current clamp circuit of FIG. 4. Of particular interest, FIG. 8 shows that has a negative temperature slope. In some implementations, to temperature compensate beta, $I_{b\_clamp}$ is linearly profiled with a positive temperature coefficient with a magnitude equal to the temperature coefficient of beta. During nominal and low current conditions, final stage base current demand is less than $I_{b\_clamp}$. The current mirror forces the $I_{b\_clamp}$ clamp current source 404 into triode operation. The beta helper transistor 410 ($M_1$) channel resistance increases causing the drain voltage ($V_d$) to increase slightly below the respective supply voltage. Additionally, FIG. 9 shows the performance of the current clamp 404 of FIG. 4 during the conditions described above.

Figure 10A:
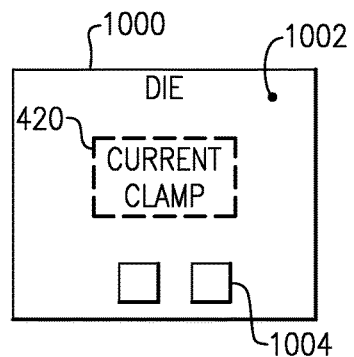
FIGS. 10A-10C are schematic diagrams of different integrated circuit implementations of the open loop current clamp circuit of FIG. 4.
Figure 10B:
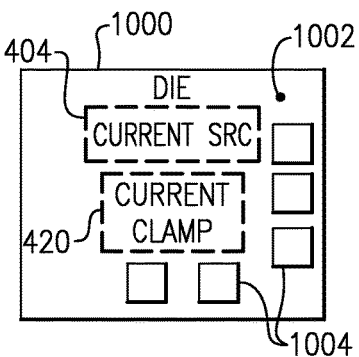
Figure 10C:
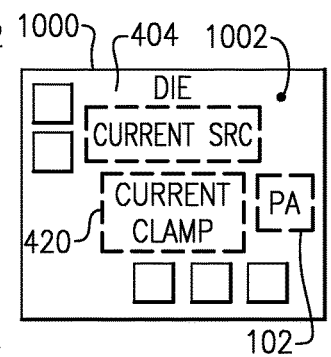

FIGS. 10A-10C are schematic diagrams of different integrated circuit implementations of the open loop current clamp circuit 420 of FIG. 4. While some example features are illustrated, those skilled in the art will appreciate from the present disclosure that various other features have not been illustrated for the sake of brevity and so as not to obscure more pertinent aspects of the example implementations disclosed herein. To that end, for example, FIG. 10A shows that in some implementations, some or all portions of the current clamp circuit 420 can be part of a semiconductor die 1000. By way of an example, the current clamp circuit 420 can be formed on a substrate 1002 of the die 1000. A plurality of connection pads 1004 can also be formed on the substrate 1002 to facilitate functionalities associated with some or all portions of the current clamp circuit 420.

FIG. 10B shows that in some implementations, a semiconductor die 1000 having a substrate 1002 can include some or all portions of the current source 404 and some or all portions of the current clamp circuit 420 of FIG. 4. A plurality of connection pads 1004 can also be formed on the substrate 1002 to facilitate functionalities associated with some or all portions of the current source 404 and some or all portions of the current clamp circuit 420 of FIG. 4.

FIG. 10C shows that in some embodiments, a semiconductor die 1000 having a substrate 1002 can include some or all portions of the PA circuit 102, some or all portions of the current source 404 and some or all portions of the current clamp circuit 420 of FIG. 4. A plurality of connection pads 1004 can also be formed on the substrate 1002 to facilitate functionalities associated with some or all portions of the PA circuit 102, the current source 404, and the current clamp circuit 420.

Figure 11:
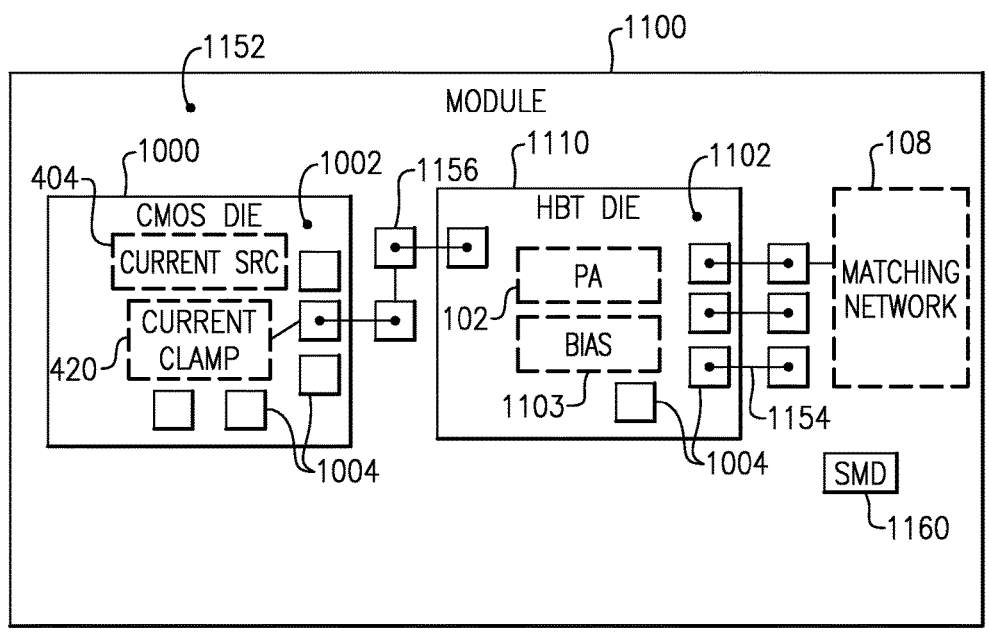
FIG. 11 is a schematic diagram of an implementation of a module including the open loop current clamp circuit of FIG. 4.

In some implementations, one or more features described herein can be included in a module. FIG. 11 is a schematic diagram of an implementation of a module 1100 including the open loop current clamp circuit 420 of FIG. 4. While some example features are illustrated, those skilled in the art will appreciate from the present disclosure that various other features have not been illustrated for the sake of brevity and so as not to obscure more pertinent aspects of the example implementations disclosed herein. The module 1100 includes a packaging substrate 1152, connection pads 1156, a CMOS (complementary metal oxide semiconductor) die 1000, a HBT (heterojunction bipolar transistor) die 1110, a matching network 108, and one or more surface mount devices 1160.

The CMOS die 1000 includes a substrate 1002 including some or all portions of the current source 404 and some or all portions of the current clamp circuit 420 of FIG. 4. A plurality of connection pads 1004 is formed on the substrate 1002 to facilitate functionalities associated with some or all portions of the current source 404 and some or all portions of the current clamp circuit 420 of FIG. 4. Similarly, the HBT die 1110 includes a substrate 1102 including some or all portions of the PA 102 and some or all portions of the bias circuitry provided to set the quiescent conditions of the PA 102. The HBT die 1110 also includes a plurality of connection pads 1004 formed on the substrate 1102 to facilitate functionalities associated with some or all portions of the PA 102 and some or all portions of the bias circuitry 1103.

The connection pads 1156 on the packaging substrate 1152 facilitate electrical connections to and from each of the CMOS die 1000 and the HBT die 1100. For example, the connection pads 1156 facilitate the use of wirebonds 1154 for passing various signals and supply currents and/or voltages to each of the CMOS die 1000 and the HBT die 1100.

In some implementations, the components mounted on the packaging substrate 1152 or formed on or in the packaging substrate 1152 can further include, for example, one or more surface mount devices (SMDs) (e.g., 1160) and one or more matching networks (e.g., 108). In some embodiments, the packaging substrate 1152 can include a laminate substrate.

In some implementations, the module 1100 can also include one or more packaging structures to, for example, provide protection and facilitate easier handling of the module 1100. Such a packaging structure can include an overmold formed over the packaging substrate 1152 and dimensioned to substantially encapsulate the various circuits and components thereon.

It will be understood that although the module 1150 is described in the context of wirebond-based electrical connections, one or more features of the present disclosure can also be implemented in other packaging configurations, including flip-chip configurations.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. That is, those skilled in the art will also appreciate from the present disclosure that in various implementations the power amplifier open loop current clamp may be included in various devices, such as a computer, a laptop computer, a tablet device, a netbook, an internet kiosk, a personal digital assistant, an optical modem, a base station, a repeater, a wireless router, a mobile phone, a smartphone, a gaming device, a computer server, or any other computing device. In various implementations, such devices include one or more processors, one or more types of memory, a display and/or other user interface components such as a keyboard, a touch screen display, a mouse, a track-pad, a digital camera and/or any number of supplemental devices to add functionality.

Figure 12:
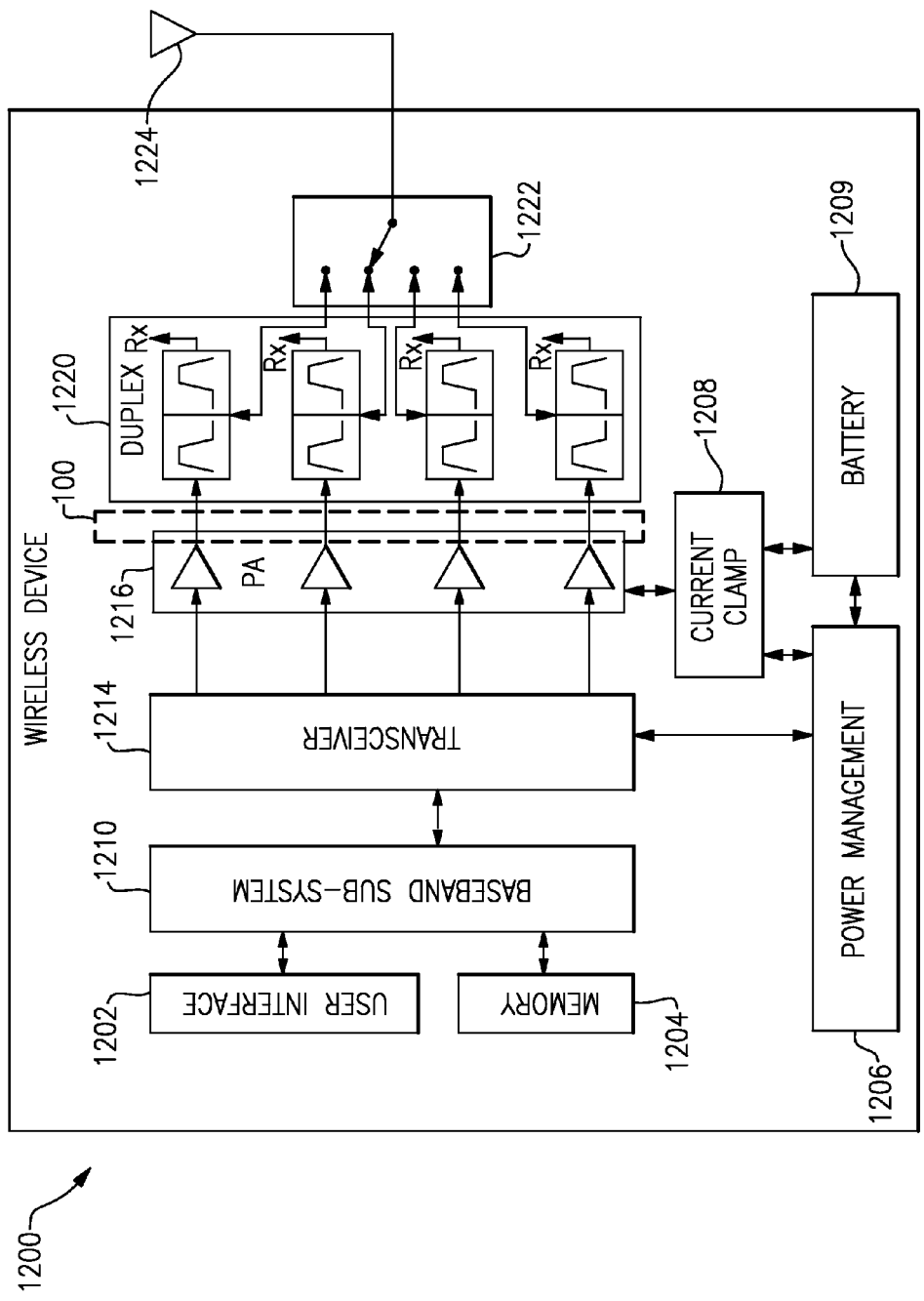
FIG. 12 is a schematic diagram of an implementation of a wireless device including the open loop current clamp circuit of FIG. 4.

FIG. 12 is a schematic diagram of an implementation of a wireless device including one or more features described herein, such as the open loop current clamp circuit of FIG. 4. While some example features are illustrated, those skilled in the art will appreciate from the present disclosure that various other features have not been illustrated for the sake of brevity and so as not to obscure more pertinent aspects of the example implementations disclosed herein.

One or more PAs 1216 as described herein are biased by respective bias circuit(s) (not shown) and compensated by respective compensation circuit(s) (not shown). In some implementations the PAs 1216 are packaged into a module including matching circuits 100. The PAs 1216 can receive respective RF signals from a transceiver 1214, that can be configured and operated in known manners to generate RF signals to be amplified and transmitted, and to process received signals. The transceiver 1214 is shown to interact with a baseband sub-system 1210 that is configured to provide conversion between data and/or voice signals suitable for a user and RF signals suitable for the transceiver 1214. The transceiver 1214 is also shown to be connected to a power management component 1206 that is configured to manage power for the operation of the wireless device 1200. Such power management can also control operations of the baseband sub-system 1210, the current clamp 1208 coupled to the PAs 1216, and access to the battery 1209.

The baseband sub-system 1210 is shown to be connected to a user interface 1202 to facilitate various input and output of voice and/or data provided to and received from the user.

The baseband sub-system 1210 can also be connected to a memory 1204 that is configured to store data and/or instructions to facilitate the operation of the wireless device, and/or to provide storage of information for the user.

In the example wireless device 1200, outputs of the PAs 1216 are shown to be matched and routed to an antenna 1224 via respective duplexers 1220 and a band-selection switch 1222. The band-selection switch 1222 can include, for example, a single-pole-multiple-throw (e.g., SP4T) switch to allow selection of an operating band (e.g., Band 2). In some embodiments, each duplexer 1220 can allow transmit and receive operations to be performed simultaneously using a common antenna (e.g., 1224). In FIG. 17, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

While various aspects of implementations within the scope of the appended claims are described above, it should be apparent that the various features of implementations described above may be embodied in a wide variety of forms and that any specific structure and/or function described above is merely illustrative. Based on the present disclosure one skilled in the art should appreciate that an aspect described herein may be implemented independently of any other aspects and that two or more of these aspects may be combined in various ways. For example, an apparatus may be implemented and/or a method may be practiced using any number of the aspects set forth herein. In addition, such an apparatus may be implemented and/or such a method may be practiced using other structure and/or functionality in addition to or other than one or more of the aspects set forth herein.

It will also be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

What is claimed is:

1. An open loop current clamp to restrict the current draw of a first transistor, the open loop current clamp comprising:
a current trim module including a voltage source having a voltage output terminal to provide a reference voltage, an adjustable resistive load and a control value generator configured to provide a control value as a function of the reference voltage and a voltage drop across the adjustable resistive load; and
a limiting first current source having respective input and output terminals, the input terminal coupled to the current trim module to receive the control value, and the output terminal coupled to a first control terminal of the first transistor to provide a limiting electrical level produced in response to the control value, such that the limiting electrical level substantially sets a first mode of operation for the first transistor such that the current draw of the first transistor is substantially determined by the first mode of operation and the limiting electrical level such that a voltage at a first output terminal of the first transistor exerts reduced influence on the current draw.

2. The open loop current clamp of claim 1 further comprising a current mirror including a second transistor, the second transistor having a second control terminal and a second input terminal, the second control terminal of the second transistor coupled to the first control terminal of the first transistor, and the current mirror also including a second current source coupled to the second input terminal of the second transistor to form an input portion of the current mirror, the second current source provided to set the nominal DC current drawn by the input portion of the current mirror, and an output portion of the current mirror includes the first transistor.

3. The open loop current clamp of claim 2 further comprising a resistor and capacitor in series between the second input terminal and second control terminal of the second transistor.

4. The open loop current clamp of claim 2 wherein the first and second transistors are together characterized by a device area ratio that is used to determine in part the current drawn by the first transistor relative to the output of the second current source coupled to the second transistor.

5. The open loop current clamp of claim 2 further comprising a gain helper having first, second and third terminals, wherein the first terminal is coupled to the output of the second current source, the second terminal is coupled to the output of the limiting first current source, and the third terminal is coupled to the first control terminal of the first transistor.

6. The open loop current clamp of claim 5 wherein the gain helper is a transistor.

7. The open loop current clamp of claim 6 wherein the first and second transistors are bipolar junction transistors, the gain helper is a metal oxide semiconductor transistor, and the gain is defined as the current gain of a bipolar junction transistor.

8. The open loop current clamp of claim 1 wherein the first transistor comprises a bipolar junction transistor, and the limiting electrical level is a current provided to the base of the bipolar junction transistor.

9. The open loop current clamp of claim 1 wherein the control value is a function of the difference between the reference voltage and the voltage drop across the resistive load.

10. The open loop current clamp of claim 1 wherein the adjustable resistive load comprises:
a plurality of parallel resistors selectively connectable to a common node;
a plurality of switches coupled to selectively connect one or more of the respective resistors to the common node in order to change the effective resistance of the adjustable resistive load; and
a control bus coupled to the plurality of switches to provide respective control signals.

11. The open loop current clamp of claim 1 wherein the first transistor is a bipolar junction transistor.

12. The open loop current clamp of claim 1 wherein the first transistor is heterojunction bipolar transistor.

13. The open loop current clamp of claim 1 wherein the limiting first current source and current trim module are included on a first die that is separate from a second die including the first transistor.

14. The open loop current clamp of claim 1 wherein the limiting first current source and current trim module are included on the same die as the first transistor.

15. The open loop current clamp of claim 1 wherein the limiting first current source includes an adjustable current mirror, the adjustable current mirror comprising:
a plurality of parallel transistors selectively connectable to a common node;
a plurality of switches coupled to selectively connect one or more of the respective transistors to the common node in order set a reference current of the adjustable current mirror; and
a control bus coupled to the plurality of switches to provide respective control signals.

16. A power amplifier module comprising:
a packaging substrate configured to receive a plurality of components;
a power amplifier circuit provided in a die included on the packaging substrate, the power amplifier including a first transistor having a first control terminal and a first output terminal;
a current trim module including a voltage source having a voltage output terminal to provide a reference voltage, an adjustable resistive load and a control value generator configured to provide a control value as a function of the reference voltage and a voltage drop across the adjustable resistive load; and
a limiting first current source having respective input and output terminals, the input terminal coupled to the current trim module to receive the control value, and the output terminal coupled to the first control terminal of the first transistor to provide a limiting electrical level produced in response to the control value, such that the limiting electrical level substantially sets a first mode of operation for the first transistor such that the current draw of the first transistor is substantially determined by the first mode of operation and the limiting electrical level such that a voltage at the first output terminal of the first transistor exerts reduced influence on the current draw.

17. The power amplifier module of claim 16 wherein at least a portion of one of the current trim module and limiting first current source is provided on the same die as the power amplifier.

18. The power amplifier module of claim 17 wherein the die is a heterojunction bipolar junction transistor die.

19. A radio frequency (RF) device comprising:
a transceiver configured to process RF signals;
an antenna in communication with the transceiver configured to facilitate transmission of an amplified RF signal; and
a power amplifier module connected to the transceiver and configured to generate the amplified RF signal, the power amplifier module including a first transistor, a current trim module including a voltage source having a voltage output terminal to provide a reference voltage, an adjustable resistive load and a control value generator configured to provide a control value as a function of the reference voltage and a voltage drop across the adjustable resistive load, and a limiting first current source having respective input and output terminals, the input terminal coupled to the current trim module to receive the control value, and the output terminal coupled to a first control terminal of the first transistor to provide a limiting electrical level produced in response to the control value, such that the limiting electrical level substantially sets a first mode of operation for the first transistor such that the current draw of the first transistor is substantially determined by the first mode of operation and the limiting electrical level such that a voltage at a first output terminal of the first transistor exerts reduced influence on the current draw.

20. The radio frequency (RF) device of claim 19 wherein the adjustable resistive load comprises:
a plurality of parallel resistors selectively connectable to a common node;
a plurality of switches coupled to selectively connect one or more of the respective resistors to the common node in order to change the effective resistance of the adjustable resistive load; and
a control bus coupled to the plurality of switches to provide respective control signals.

* * * * *